(12) United States Patent
Zhang

(10) Patent No.: US 11,486,936 B2
(45) Date of Patent: Nov. 1, 2022

(54) POWER SUPPLY ON-OFF DETECTION CIRCUIT, METHOD, AND STORAGE MEDIUM

(71) Applicant: BEIJING XIAOMI MOBILE SOFTWARE CO., LTD., Beijing (CN)

(72) Inventor: He Zhang, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 175 days.

(21) Appl. No.: 17/039,896

(22) Filed: Sep. 30, 2020

(65) Prior Publication Data

US 2021/0356529 A1 Nov. 18, 2021

(30) Foreign Application Priority Data

May 15, 2020 (CN) .......................... 202010415218.9

(51) Int. Cl.
*G01R 31/40* (2020.01)
*G01R 31/327* (2006.01)

(52) U.S. Cl.
CPC .......... *G01R 31/40* (2013.01); *G01R 31/327* (2013.01)

(58) Field of Classification Search
CPC ........ G01R 31/327–3336; G01R 31/40; G01R 31/42
See application file for complete search history.

(56) References Cited

U.S. PATENT DOCUMENTS

| | | | | |
|---|---|---|---|---|
| 2006/0061480 A1* | 3/2006 | Bowman | ............. | G01R 31/343 324/123 R |
| 2008/0130336 A1* | 6/2008 | Taguchi | ............. | H02M 1/4225 363/125 |
| 2009/0115400 A1 | 5/2009 | Hunter | | |
| 2012/0063187 A1* | 3/2012 | Sato | .................... | H02M 3/3374 363/131 |
| 2013/0322898 A1* | 12/2013 | Koseki | .................... | G03G 15/80 399/37 |
| 2015/0333509 A1 | 11/2015 | Jankowski | | |
| 2017/0219639 A1* | 8/2017 | Boudreau | ............ | G01R 15/146 |
| 2019/0056132 A1* | 2/2019 | Warren | .................... | F24F 11/62 |
| 2019/0214847 A1* | 7/2019 | Tamai | .................... | H02J 9/062 |
| 2020/0153227 A1* | 5/2020 | Carlson | ............. | G01R 19/0092 |

OTHER PUBLICATIONS

Extended European Search Report (EESR) for EP application 20217014.8 dated Jun. 16, 2021.

* cited by examiner

*Primary Examiner* — Huy Q Phan
*Assistant Examiner* — David B Frederiksen
(74) *Attorney, Agent, or Firm* — Syncoda LLC; Feng Ma

(57) ABSTRACT

A power supply on-off detection circuit includes: a signal acquisition circuit, a signal conversion circuit, and a signal processing circuit. The signal acquisition circuit is coupled to a power supply through a switch, and is configured to collect an alternating current signal output by the power supply, and to output the alternating current signal to the signal conversion circuit. The signal conversion circuit is configured to convert the alternating current signal into a voltage signal, and to output the voltage signal to the signal processing circuit. The signal processing circuit is coupled to the signal conversion circuit, and is configured to convert the voltage signal into a level signal. The level signal is used to determine whether the power supply is on or off by determining whether the switch is switched on or off.

16 Claims, 4 Drawing Sheets

POWER SUPPLY ON-OFF DETECTION CIRCUIT, METHOD, AND STORAGE MEDIUM

CROSS-REFERENCE TO RELATED APPLICATION

This application claims priority to Chinese patent application No. 202010415218.9 filed on May 15, 2020, the disclosure of which is hereby incorporate by reference in its entirety.

BACKGROUND

With developments of Smart Home technologies, a number of different types of smart appliances have emerged. Generally, after a local power supply switch is turned off, the smart appliances are switched off, and the smart appliances are unable to be remotely controlled by a terminal. Therefore, flash break switches are widely used in the smart appliances. In a normal state, a flash break switch maintains a connection between a power supply and a power consumption load. When pressed by an external force, the flash break switch turns off the connection between the power supply and the power consumption load. After the external force is released, the flash break switch rapidly returns to the normal state.

SUMMARY

The present disclosure relates to a field of switch technologies, and more specifically to a power supply on-off detection circuit, a power supply on-off detection method, a power supply on-off detection apparatus, and a storage medium.

In a first aspect, a power supply on-off detection circuit is provided, this circuit includes: a signal acquisition circuit, a signal conversion circuit, and a signal processing circuit.

The signal acquisition circuit is coupled to a power supply through a switch, and is configured to collect an alternating current signal output by the power supply, and to output the alternating current signal to the signal conversion circuit.

The signal conversion circuit is configured to convert the alternating current signal into a voltage signal, and to output the voltage signal to the signal processing circuit.

The signal processing circuit is coupled to the signal conversion circuit, and is configured to convert the voltage signal into a level signal, in which the level signal is used to determine whether the power supply is on or off by determining whether the switch is switched on or off.

In a second aspect, a power supply on-off detection method is provided. The method includes: collecting an alternating current signal of a power supply, and converting the alternating current signal into a voltage signal; determining a level signal representing a change state of the alternating current signal based on the voltage signal; and determining whether the power supply is on or off by determining whether a switch coupled to the power supply is switched on or off based on the level signal.

In a third aspect, a non-transitory computer-readable storage medium is provided. When instructions in the storage medium are executed by a processor of an electronic device, the electronic device is caused to execute a power supply on-off detection method. The method includes: collecting an alternating current signal output by a power supply, and converting the alternating current signal into a voltage signal; determining a level signal representing a change state of the alternating current signal based on the voltage signal; and determining whether the power supply is on or off by determining whether a switch coupled to the power supply is switched on or off based on the level signal.

It should be understood that the above general description and the following detailed description are only exemplary and explanatory, and do not limit the present disclosure.

BRIEF DESCRIPTION OF THE DRAWINGS

The drawings herein are incorporated into the specification and constitute a part of the disclosure, and illustrate the embodiments consistent with the disclosure, and used to explain the principle of the disclosure with the specification.

DETAILED DESCRIPTION

Reference will now be made in detail to exemplary embodiments, examples of which are illustrated in the accompanying drawings. The following description refers to the accompanying drawings in which the same numbers in different drawings represent the same or similar elements unless otherwise represented. The implementations set forth in the following description of exemplary embodiments do not represent all implementations consistent with the present disclosure. Instead, they are merely examples of apparatuses and methods consistent with aspects related to the present disclosure as recited in the appended claims.

Various embodiments of the present disclosure provide a power supply on-off detection circuit for switches in smart appliances, which is used to detect an on-off state of the switches. Various embodiments of the present disclosure are described using a flash break switch as an example.

Figure 1:
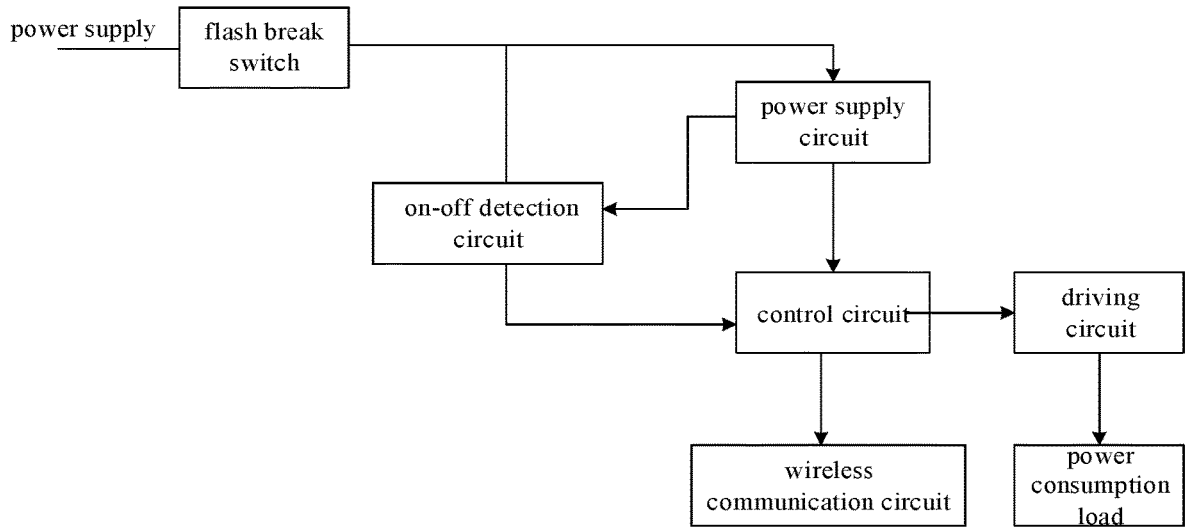
FIG. 1 is an overall block diagram of a smart appliance with a power supply on-off detection circuit according to some embodiments.

FIG. 1 is an overall block diagram of a smart appliance with a power supply on-off detection circuit according to some embodiments. As illustrated in FIG. 1, the smart appliance is coupled to the power supply through the flash break switch. The flash break switch is used to prevent the smart appliance from switching off a communication connection with a terminal after the smart appliance is switched off from the power supply. However, when the flash break switch is used, there must be a corresponding functional circuit, that is, the smart appliance needs to be equipped with an on-off detection circuit to detect the on-off state of the flash break switch. In addition to the on-off detection circuit, the smart appliance may also include a power supply circuit, a control circuit, a driving circuit, a wireless communication circuit, and a power consumption load. The voltage output by the flash break switch is output to the on-off detection circuit and the power supply circuit, and the power supply circuit of the flash break switch is coupled to the on-off detection circuit of the flash break switch and the control circuit of the smart appliance. The output end of the on-off detection circuit is coupled to the control circuit of the smart appliance. The control circuit is respectively coupled to the driving circuit and the wireless communication circuit. The driving circuit is coupled to the power consumption load. The power consumption load of the smart appliance can be a load that uses a direct current (DC) power supply, such as LED matrix, or be an alternating current (AC) load coupled through a relay. If the power consumption load is an AC load such as an AC motor, the driving circuit of the smart appliance is coupled to the AC motor through the relay.

Wireless communication modes include but are not limited to ZigBee, Ble, Wi-Fi, infrared, and radio frequency communication of ISM frequency band. A power consumption device can communicate with upper computers such as mobile phones and gateways through the wireless communication module, and upload current status of the power consumption device and receive remote control commands to realize remote control function of the power consumption device.

Figure 2:
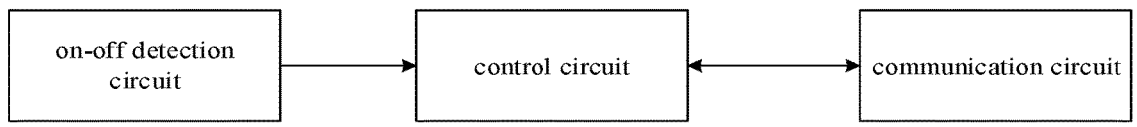
FIG. 2 is a block diagram of a wireless module supporting on-off detection of a power supply on-off detection circuit according to some embodiments.

FIG. 2 is a block diagram of a wireless module supporting on-off detection of a power supply on-off detection circuit according to some embodiments. As illustrated in FIG. 2, the on-off detection circuit sends detection information to the control circuit. A bidirectional communication between the control circuit and the communication circuit is carried out. The control circuit sends the detection information to the communication circuit, and the communication circuit communicates with the terminal based on the detection information. The communication circuit may also send information about the communication connection with the terminal to the control circuit.

Various embodiments of the present disclosure provide a power supply on-off detection circuit based on the on-off detection circuit, which can include a signal acquisition circuit, a signal conversion circuit and a signal processing circuit. According to some embodiments of the present disclosure, the input alternating current signal can be finally converted into a level signal that can determine the state of the switch to assist the determination of action times of the switch, thereby realizing identification of actions of the switch and switching the state of the power consumption load. The present disclosure has optimized small current signals to solve the problem of low detection sensitivity of small current signals. Meanwhile, in a determination realization method, a state change of a current of a primary side of a transformer when the flash break switch is switched on or off is converted into a level signal to realize state determination, which is more reliable and faster, and saves the resources of the control circuit and reduces the power consumption.

Figure 3:
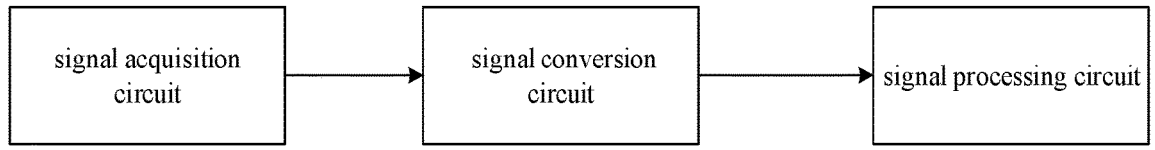
FIG. 3 is a block diagram of a power supply on-off detection circuit according to some embodiments.

FIG. 3 is a block diagram of a power supply on-off detection circuit according to some embodiments. As illustrated in FIG. 3, the power supply on-off detection circuit includes a signal acquisition circuit, a signal conversion circuit, and a signal processing circuit.

Figure 4:
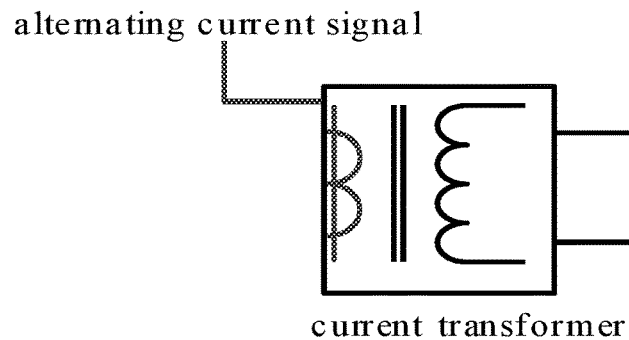
FIG. 4 is a block diagram of a signal acquisition circuit of a power supply on-off detection circuit according to some embodiments.

The signal acquisition circuit is coupled to a power supply through a switch, and is configured to collect an alternating current signal output by the power supply, and to output the alternating current signal to the signal conversion circuit FIG. 4 is a block diagram of a signal acquisition circuit of a power supply on-off detection circuit according to some embodiments. As illustrated in FIG. 4, in the embodiment of the present disclosure, the signal acquisition circuit includes a current transformer and a protection circuit.

In some embodiments of the present disclosure, the current transformer obtains the alternating current signal based on the action of the flash break switch. For example, if the obtained alternating current signal is 50 Hz, the alternating current signal of the primary side of the current transformer is 50 Hz. The current transformer corresponding to coils is selected according to a preset ratio, and the alternating current signal of the primary side of the current transformer is coupled to a secondary side of the current transformer according to a principle of electromagnetic conversion to obtain a reduced alternating current signal according to the preset ratio.

In some embodiments, the protection circuit may use a transient voltage suppression diode (TVS tube). The transient voltage suppression diode is coupled in parallel with the current transformer. The transient voltage suppression diode is used as a protection circuit to discharge a surge current of the current transformer, add surge protection, and prevent damage to components of a post-circuit. The transient voltage suppression diode can also be used to prevent the secondary circuit of the current transformer open circuit caused by abnormalities of the components of post-circuit.

The signal conversion circuit is configured to convert the alternating current signal into a voltage signal, and to output the voltage signal to the signal processing circuit.

In the embodiments of the present disclosure, for converting the received alternating current signal into the voltage signal, a resistive resistor may be selected to pass the current, or a transistor, or an operational amplifier may be used. The present disclosure uses a rectifier bridge and a load resistor to convert the alternating current signal into the voltage signal.

It should be understood that the current transformer may also be replaced by other components based on the principle of electromagnetic conversion, such as a transformer, or a Hall sensor. The specific selection of electromagnetic conversion components is not limited in this application.

Figure 5:
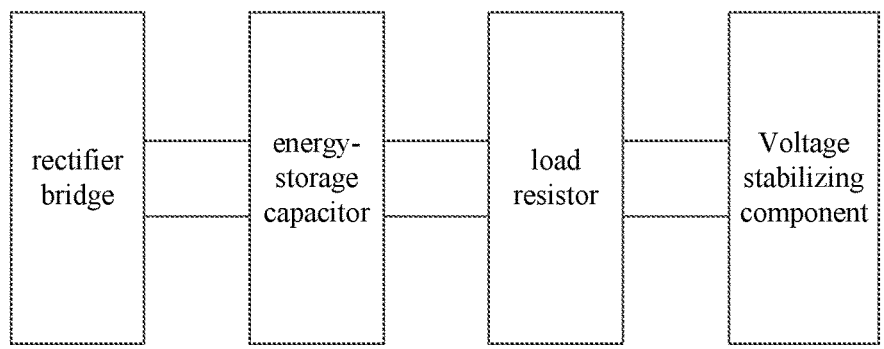
FIG. 5 is a block diagram of a signal conversion circuit of a power supply on-off detection circuit according to some embodiments.

FIG. 5 is a block diagram of a signal conversion circuit of a power supply on-off detection circuit according to some embodiments. As illustrated in FIG. 5, the signal conversion circuit includes: the rectifier bridge, an energy-storage capacitor, the load resistor, and a voltage stabilizing component.

In some embodiments of the present disclosure, the rectifier bridge is coupled in parallel with the signal acquisition circuit to convert the alternating current signal output by the signal acquisition circuit into a direct current signal. The load resistor is coupled in parallel with the rectifier bridge to convert the direct current signal into the voltage signal according to Ohm's law U=RI. Further, the load resistor may also play a role of discharging current in a power-off state to rapidly and completely discharge electric charge of the energy-storage capacitor.

In some embodiments, in order to enable the signal conversion circuit to achieve better effect in a process of converting the alternating current signal into the voltage signal, the energy-storage capacitor and the voltage stabilizing component are added to the signal conversion circuit.

The energy-storage capacitor is coupled in parallel with the rectifier bridge to filter a pulsating DC current signal output by the rectifier bridge to obtain a smooth DC current signal. As the power supply provides the alternating current, when the current of the alternating current is almost zero near zero crossing points, the converted voltage may also be zero, resulting in misjudgments. The energy-storage capacitor may ensure that the voltage will not be zero at the zero crossing points. The voltage stabilizing component is coupled in parallel with the load resistor, and is configured to stabilize the voltage signal output by the load resistor that passing a DC current signal, and to prevent the components of the post-circuit from being damaged by high voltage input the post-circuit.

In some embodiments, the signal conversion circuit further includes a current limiting resistor, and the current limiting resistor is coupled in series with one of two output ends of the rectifier bridge to prevent a large peak current from damaging the components of post-circuit.

The signal processing circuit is coupled to the signal conversion circuit, and is configured to convert the voltage signal into a level signal, in which the level signal is used to determine whether the power supply is on or off by determining whether the switch is switched on or off.

In some embodiments, the signal processing circuit processes the voltage signal obtained by a pre-circuit to obtain a high-low-level signal. The level signal is sent to a Microcontroller Unit (MCU) of the post-circuit for processing. The level signal recognized by the MCU determines the switched on or off state of the flash break switch, further determines the on and off of the power supply, and control to switch an operation of the power consumption load.

In some embodiments, the signal processing circuit includes two portions: a signal amplifying portion and a signal processing portion. Since the alternating current signal obtained by the current transformer may be too low, the current change state of the current transformer may not be obvious, resulting in output errors of high or low level in the process of the signal processing and conversing into the level signal. Therefore, it is necessary to use a signal amplifying circuit to amplify the alternating current signal whose signal value is too low. Furthermore, it is possible to avoid misjudgment of the state of the flash break switch caused by the alternating current signal obtained is too low. The signal amplifying circuit may select a signal amplifier arranged in the signal processing circuit, or select other signal amplifying circuits to add to the signal acquisition circuit to amplify the alternating current signal obtained by the current transformer.

Figure 6:
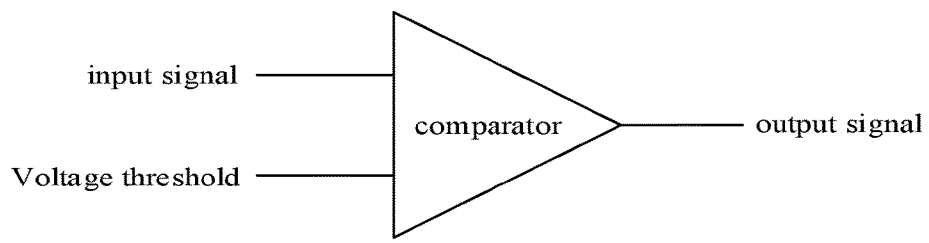
FIG. 6 is a block diagram of a signal comparison circuit of a power supply on-off detection circuit according to some embodiments.

The signal processing portion includes a signal comparison circuit and voltage divider resistors. The signal comparison circuit compares the obtained voltage signal with a preset voltage threshold to output the high-low-level signal. FIG. 6 is a block diagram of a signal comparison circuit of a power supply on-off detection circuit according to some embodiments. As illustrated in FIG. 6, some embodiments of the present disclosure selects a voltage comparator as the signal comparison circuit. Taking the voltage signal obtained by the pre-circuit and the preset voltage threshold as inputs of the voltage comparator, the output signal of the voltage comparator is the high-low-level signal. A first input end of the voltage comparator is coupled to an output end of the signal conversion circuit to receive the voltage signal, and a second input end of the voltage comparator is coupled to the voltage divider resistors to receive a reference voltage.

In some embodiments of the present disclosure, when the flash break switch is switched on or off the alternating current signal obtained by the primary side of the current transformer changes. For example, when the flash break switch is switched on, the alternating current signal of the primary side of the current transformer changes from a small current to no current and then to a large current. And when the flash break switch is switched off, the alternating current signal of the primary side of the current transformer changes from the large current to no current and then to the small current. According to the power supply on-off detection circuit provided by the present disclosure, a change state of a AC current signal generated by the switched on or off state of the flash break switch is processed to obtain the corresponding high or low level signal, and the high or low level signal is further transmitted to the MCU to determine the state of the power supply, in order to control the state change of the power consumption load.

The power supply on-off detection circuit according to some embodiments of the present disclosure can determine the high or low level signal by obtaining the alternating current signal of the primary side of the current transformer to detect the switched on or off state of the switch. The detection for determining the switched on or off state of the switch has short period and high accuracy.

Based on the power supply on-off detection circuit according to some embodiments of the present disclosure, any switch may be detected, which is not limited to the flash break switch involved in the foregoing embodiments. The foregoing embodiment of the present disclosure takes the flash break switch as an example for description. In addition, the present disclosure may also be used to detect the on-off of the direct current power supply, and the implementation method is the same as that of detecting the on-off of the power supply through the alternating current.

Figure 7:
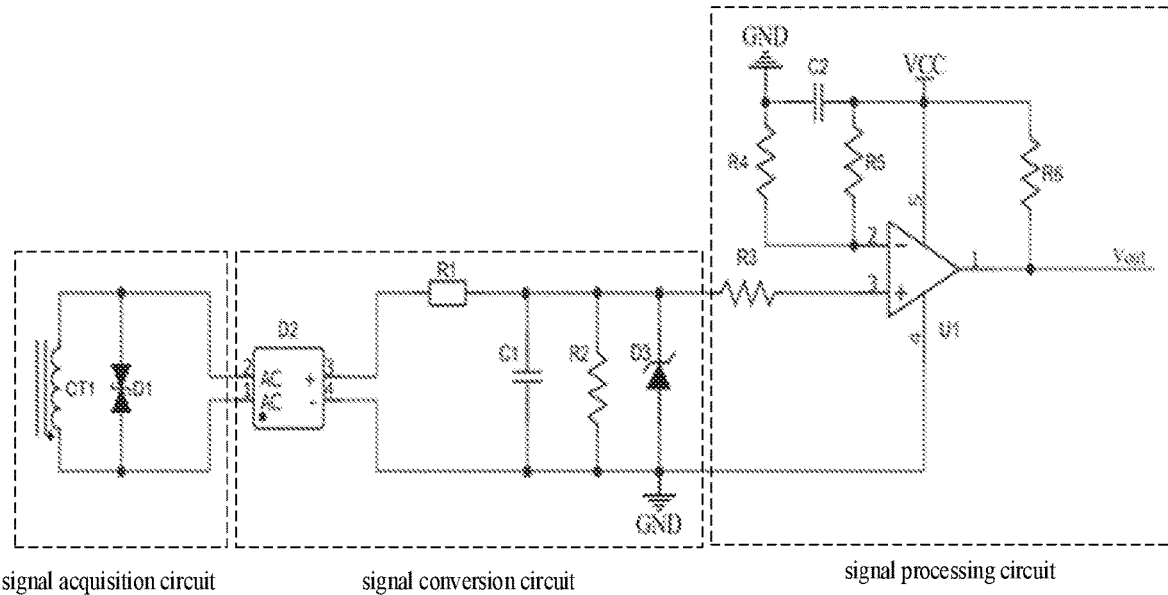
FIG. 7 is a block diagram of a power supply on-off detection circuit according to some embodiments.

FIG. 7 is a block diagram of a power supply on-off detection circuit according to some embodiments. As illustrated in FIG. 7, CT1 is the current transformer, D1 is the transient voltage suppression diode, R1 is the current limiting resistor, CI is the energy-storage capacitor, R2 is the load resistor, D3 is a stabilized voltage diode, U1 is the voltage comparator, R4, R5 are voltage divider resistors, R3 is a resistor, and VCC is a power supply. Based on the above electronic components, the power supply on-off detection circuit according to some embodiments of the present disclosure is constructed.

Figure 8:
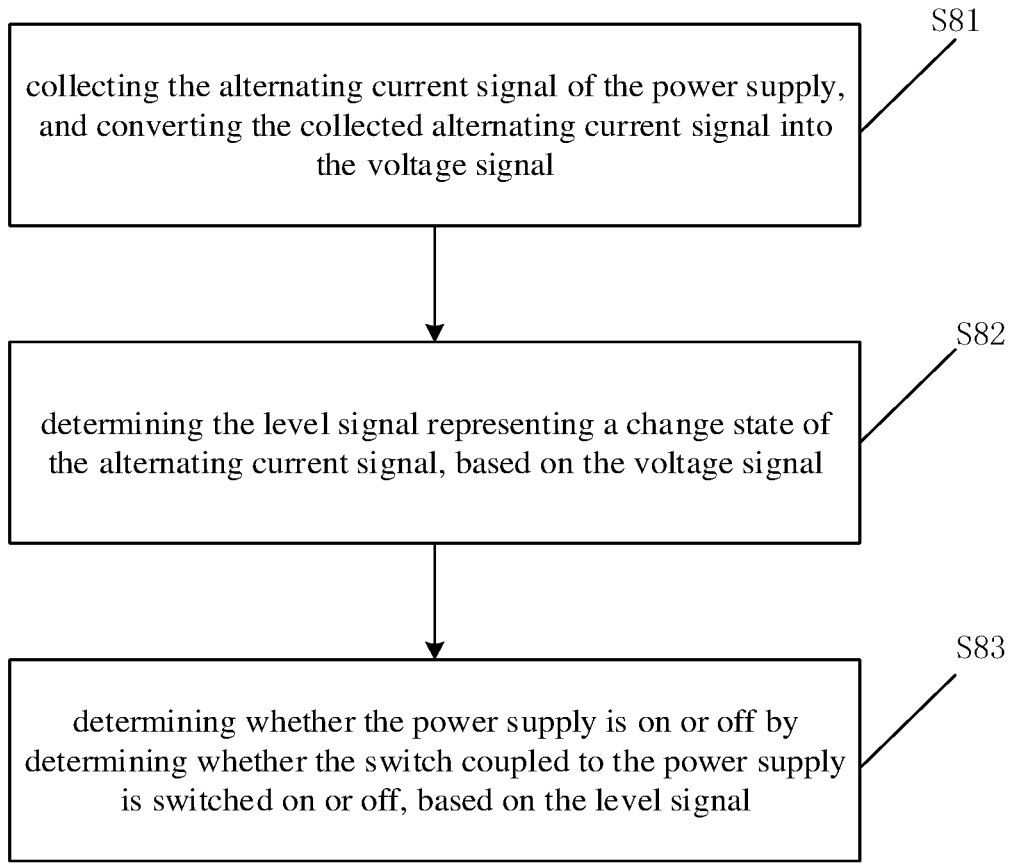
FIG. 8 is a flowchart of a power supply on-off detection method according to some embodiments.

FIG. 8 is a flowchart of a power supply on-off detection method according to some embodiments. As illustrated in FIG. 8, the power supply on-off detection method includes the following steps.

At step S81, the alternating current signal of the power supply is collected, and the alternating current signal is converted into the voltage signal.

In the embodiments of the present disclosure, the signal acquisition circuit in the power supply on-off detection circuit is configured to collect the alternating current signal of the power supply, and the signal conversion circuit in the power supply on-off detection circuit is configured to convert the alternating current signal into the voltage signal.

At step S82, the level signal representing a change state of the alternating current signal is determined, based on the voltage signal.

In the embodiments of the present disclosure, the signal processing circuit in the power supply on-off detection circuit obtains the level signal that represents a change state of the alternating current signal based on the voltage signal.

At step S83, it is determined whether the power supply is on or off by determining whether the switch coupled to the power supply is switched on or off, based on the level signal.

In some embodiments of the present disclosure, the level signal is transmitted to a MCU, and the MCU determines whether the switch is switched on or off according to the change of the level signal, and further determines the on or off of the power supply, to control the state change of the power consumption load.

In some embodiments, a primary side of a current transformer in the signal obtaining unit of the power supply on-off detection circuit collects the alternating current signal output by the power supply, and couples the alternating current signal collected by the primary side to a secondary side of the current transformer, according to a preset ratio to obtain an alternating current signal reduced to a specified value.

In some embodiments of the present disclosure, a rectifier bridge in a signal conversion circuit of the power supply on-off detection circuit converts the alternating current signal output by the signal acquisition circuit into a direct current signal, and converts the direct current signal into the voltage signal.

In some embodiments, if the collected alternating current signal is small, the alternating current signal reduced to the specified value is amplified and output based on a signal amplifying circuit.

In some embodiments of the present disclosure, the level signal output by the power supply on-off detection circuit is identified. If the level signal remains a low level within a specified time period, it is determined that the switch coupled to the power supply is switched off, and the power supply is in an off state. If the level signal remains a high level within the specified time period, it is determined that the switch coupled to the power supply is switched on, and the power supply is in an on state.

In some embodiments, the coupled alternating current signal is limited by a transient voltage suppression diode in the signal acquisition circuit of the power supply on-off detection circuit. The current limiting resistor in the signal conversion circuit of the power supply on-off detection circuit limits the direct current signal exceeding a preset current value. An energy-storage capacitor in the signal conversion circuit of the power supply on-off detection circuit adjusts a zero-crossing voltage. Under a power-off condition, the voltage stabilizing component in the signal conversion circuit of the power supply on-off detection circuit discharges current through a load resistor.

Regarding the method in the foregoing embodiment, the specific manners of performing operations of each circuit and components in the circuit have been described in detail in some embodiments referring to the circuit, which is not repeated herein.

Based on the same concept, some embodiments of the present disclosure also provides a power supply on-off detection apparatus.

It is understood that, in order to realize the above-mentioned functions, the power supply on-off detection apparatus according to the embodiments of the present disclosure includes hardware structures and/or software modules corresponding to each function. In combination with the units and algorithm steps of the examples disclosed in the embodiments of the present disclosure, the embodiments of the present disclosure are implemented in the form of hardware or a combination of hardware and computer software. Whether a certain function is executed by hardware or computer software-driven hardware depends on the specific application and design constraint conditions of the technical solution. Those skilled in the art may use different methods for each specific application to implement the described functions, but such implementation should not be considered as going beyond the scope of the technical solution of the embodiments of the present disclosure.

Figure 9:
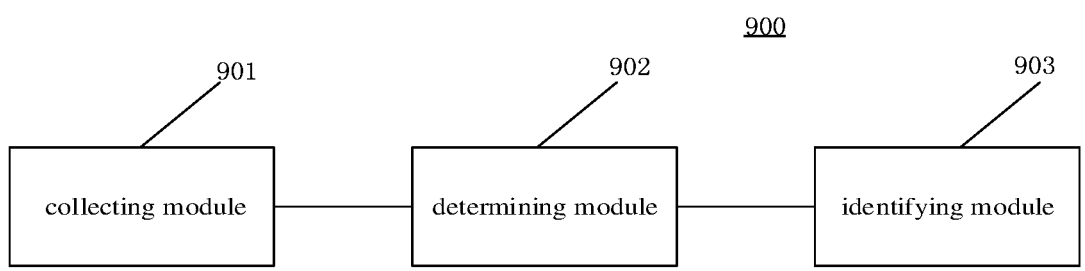
FIG. 9 is a block diagram of a power supply on-off detection apparatus according to some embodiments.

FIG. 9 is a block diagram of a power supply on-off detection apparatus 900 according to some embodiments. As illustrated in FIG. 9, the apparatus 900 includes: a collecting module 901, a determining module 902, and an identifying module 903.

The collecting module 901 is configured to collect the alternating current signal of the power supply, and convert the alternating current signal into the voltage signal. The determining module 902 is configured to, determine the level signal representing a change state of the alternating current signal, based on the voltage signal. The identifying module 903 is configured to, determine whether the power supply is on or off by determining whether the switch coupled to the power supply is switched on or off, based on the level signal.

The collecting module 901 is configured to couple the alternating current signal collected by a primary side to a secondary side according to a preset ratio to obtain an alternating current signal reduced to a specified value, based on the alternating current signal output by the power supply and collected by the primary side of the current transformer.

The collecting module 901 is configured to use the following implementation to convert the collected alternating current signal into a voltage signal.

The alternating current signal output by the signal acquisition circuit is converted into a direct current signal by a rectifier bridge, and the direct current signal is converted into a voltage signal.

The determining module 902 is configured to before determining the level signal representing the change state of the alternating current signal, amplify the alternating current signal reduced to the specified value by a signal amplifying circuit, and to output the amplified alternating current signal.

The identifying module 903 is configured to, if the level signal remains a low level within a specified time period, determine that the switch coupled to the power supply is off, and determine that the power supply is in an switched off state; and if the level signal remains a high level within the specified time period, determine that the switch coupled to the power supply is switched on, and determine that the power supply is in a on state.

The determining module 902 is configured to limit the coupled alternating current signal by a transient voltage suppression diode.

The determining module 902 is configured to limit a direct current signal exceeding a preset current value by a current limiting resistor.

The determining module 902 is configured to adjust a zero-crossing voltage by an energy-storage capacitor.

The determining module 902 is configured to, under a power-off condition, discharge current through a load resistor based on a voltage stabilizing component.

Regarding the apparatus in the foregoing embodiment, the specific manner in which each module performs the operation has been described in detail in some embodiments of the method, and detailed description is not given here.

Figure 10:
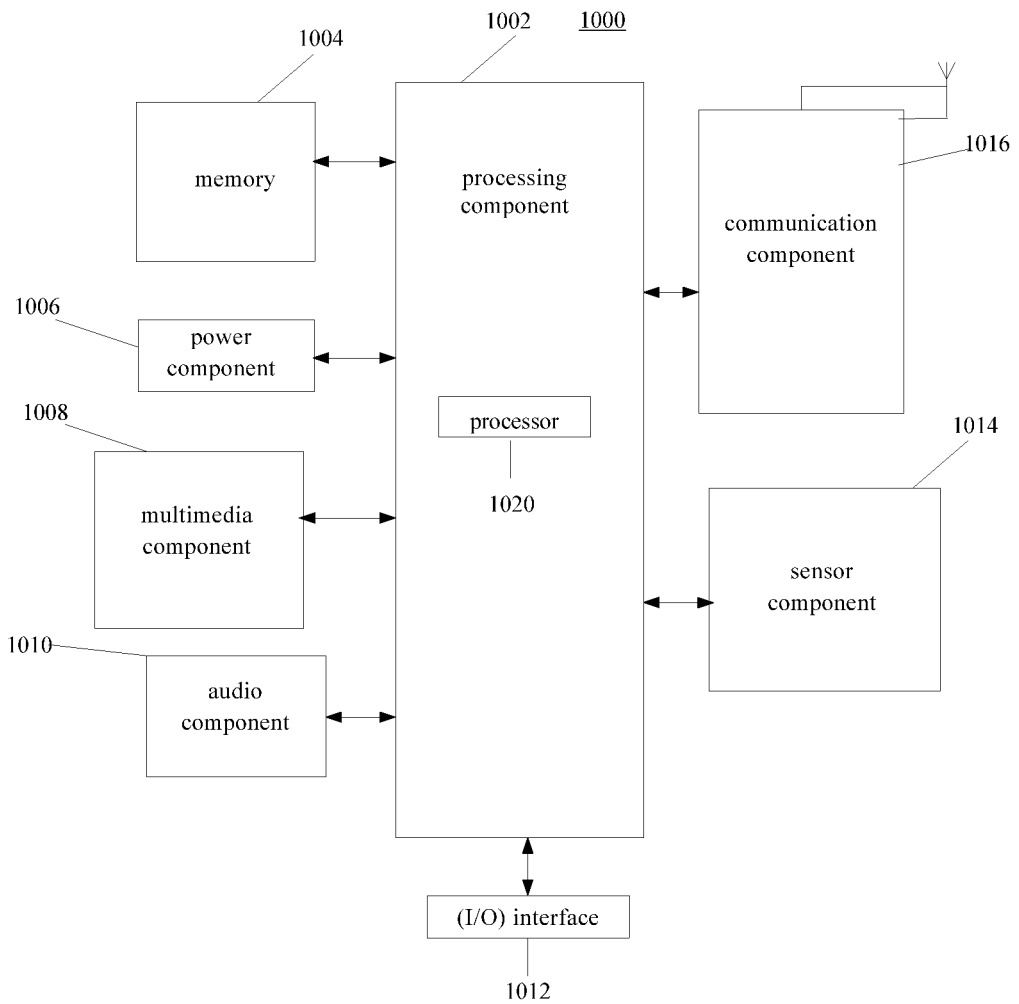
FIG. 10 is a block diagram of an apparatus according to some embodiments.

FIG. 10 is a block diagram of a power supply on-off detection apparatus 1000 according to some embodiments. For example, the apparatus 1000 may be a mobile phone, a computer, a digital broadcasting terminal, a messaging device, a game console, a tablet device, a medical device, a fitness device, and a personal digital assistant.

As illustrated in FIG. 10, the apparatus 1000 may include one or more of the following components: a processing component 1002, a memory 1004, a power component 1006, a multimedia component 1008, an audio component 1010, an input/output (I/O) interface 1012, a sensor component 1014, and a communication component 1016.

The processing component 1002 typically controls overall operations of the apparatus 1000, such as the operations associated with display, telephone calls, data communications, camera operations, and recording operations. The processing component 1002 may include one or more processors 1020 to execute instructions to perform all or part of the steps in the above described methods. Moreover, the processing component 1002 may include one or more modules which facilitate the interaction between the processing component 1002 and other components. For instance, the processing component 1002 may include a multimedia module to facilitate the interaction between the multimedia component 1008 and the processing component 1002.

The memory 1004 is configured to store various types of data to support the operation of the apparatus 1000. Examples of such data include instructions for any applications or methods operated on the apparatus 1000, contact data, phonebook data, messages, pictures, video, etc. The memory 1004 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 1006 provides power to various components of the apparatus 1000. The power component 1006 may include a power management system, one or more power sources, and any other components associated with the generation, management, and distribution of power in the apparatus 1000.

The multimedia component 1008 includes a screen providing an output interface between the apparatus 1000 and the user. In some embodiments, the screen may include a liquid crystal display (LCD) and a touch panel (TP). In some embodiments, organic light-emitting diode (OLED) displays can be employed.

If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 1008 includes a front camera and/or a rear camera. When the apparatus 1000 is in an operation mode, such as a shooting mode or a video mode, the front camera and/or the rear camera may receive external multimedia data. Each front camera and rear camera can be a fixed optical lens system or have focal length and optical zoom capabilities.

The audio component 1010 is configured to output and/or input audio signals. For example, the audio component 1010 includes a microphone ("MIC") configured to receive an external audio signal when the apparatus 1000 is in an operation mode, such as a call mode, a recording mode, and a voice recognition mode. The received audio signal may be further stored in the memory 1004 or transmitted via the communication component 1016. In some embodiments, the audio component 1010 further includes a speaker to output audio signals.

The I/O interface 1012 provides an interface between the processing component 1002 and peripheral interface modules, such as a keyboard, a click wheel, buttons, and the like. The buttons may include, but are not limited to, a home button, a volume button, a starting button, and a locking button.

The sensor component 1014 includes one or more sensors to provide status assessments of various aspects of the apparatus 1000. For instance, the sensor component 1014 may detect an open/closed status of the apparatus 1000, relative positioning of components, e.g., the display and the keypad, of the apparatus 1000, a change in position of the apparatus 1000 or a component of the apparatus 1000, a presence or absence of user contact with the apparatus 1000, an orientation or an acceleration/deceleration of the apparatus 1000, and a change in temperature of the apparatus 1000. The sensor component 1014 may include a proximity sensor configured to detect the presence of nearby objects without any physical contact. The sensor component 1014 may also include a light sensor, such as a CMOS or CCD image sensor, for use in imaging applications. In some embodiments, the sensor component 1014 may further include an acceleration sensor, a gyro sensor, a magnetic sensor, a pressure sensor, or a temperature sensor.

The communication component 1016 is configured to facilitate communication, wired or wirelessly, between the apparatus 1000 and other devices. The apparatus 1000 can access a wireless network based on a communication standard, such as Wi-Fi, 2G, 3G, 4G, or 5G, or a combination thereof. In one exemplary embodiment, the communication component 1016 receives a broadcast signal or broadcast associated information from an external broadcast management system via a broadcast channel. In one exemplary embodiment, the communication component 1016 further includes a near field communication (NFC) module to facilitate short-range communications. For example, the NFC module may be implemented based on a radio frequency identity (RFID) technology, an infrared data association (IrDA) technology, an ultra-wideband (UWB) technology, a Bluetooth (BT) technology, and other technologies.

In exemplary embodiments, the apparatus 1000 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In some embodiments, a storage medium including instructions is provided, such as the memory 1004 including instructions, and the foregoing instructions may be executed by the processor 1020 of the apparatus 1000 to complete the foregoing method. Optionally, the storage medium may be a non-transitory computer-readable storage medium, for example, the non-transitory computer-readable storage medium may be a ROM, a random-access memory (RAM), a CD-ROM, a magnetic tape, a floppy disk, and an optical data storage device.

The various circuits, device components, units, blocks, or portions may have modular configurations, or are composed of discrete components, but nonetheless can be referred to as "units," "modules," or "portions" in general. In other words, the "circuits," "components," "modules," "blocks," "portions," or "units" referred to herein may or may not be in modular forms, and these phrases may be interchangeably used.

It will be understood that the "plurality" in the disclosure means two or more, and other quantifiers are similar. "And/or" describes the relationship of the related objects, indicating that there may be three relationships, for example, A and/or B may indicate three cases: A exists alone, A and B exist simultaneously, and B exists alone. The character "/" generally indicates that the relationship between the contextually relevant objects is a "or" relationship. The singular forms "a," "an," and "the" are also intended to include the plural forms unless the context clearly indicates otherwise.

It will be further understood that although the terms such as "first," "second," and the like are used to describe various information, this information should not be limited by these terms. The terms are only used to distinguish the same type of information from each other, and do not indicate a specific order or importance. In fact, the expressions such as "first," "second" and the like can be used interchangeably. For instance, first information can also be referred to as second information without departing from the scope of the disclosure, and similarly, the second information can also be referred to as the first information.

It will be further understood that although the operations in the embodiments of the present disclosure are described in a specific order in the drawings, it will not be understood as requiring that the operations are performed in the specific order shown or in a serial order, or that perform all the operations shown to acquire the desired result. In certain environments, multitasking and parallel processing may be advantageous.

Those of ordinary skill in the art will understand that the above described modules/units can each be implemented by hardware, or software, or a combination of hardware and software. Those of ordinary skill in the art will also understand that multiple ones of the above described modules/units may be combined as one module/unit, and each of the above described modules/units may be further divided into a plurality of sub-modules/sub-units.

It is to be understood that the terms "lower," "upper," "center," "longitudinal," "transverse," "length," "width," "thickness," "upper," "lower," "front," "back," "left," "right," "vertical," "horizontal," "top," "bottom," "inside," "outside," "clockwise," "counter clockwise," "axial," "radial," "circumferential," "column," "row," and other orientation or positional relationships are based on example orientations illustrated in the drawings, and are merely for the convenience of the description of some embodiments, rather than indicating or implying the device or component being constructed and operated in a particular orientation. Therefore, these terms are not to be construed as limiting the scope of the present disclosure.

In the present disclosure, the terms "installed," "connected," "coupled," "fixed" and the like shall be understood broadly, and may be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the present disclosure, a first element being "on," "over," or "below" a second element may indicate direct contact between the first and second elements, without contact, or indirect through an intermediate medium, unless otherwise explicitly stated and defined.

Moreover, a first element being "above," "over," or "at an upper surface of" a second element may indicate that the first element is directly above the second element, or merely that the first element is at a level higher than the second element. The first element "below," "underneath," or "at a lower surface of" the second element may indicate that the first element is directly below the second element, or merely that the first element is at a level lower than the second feature. The first and second elements may or may not be in contact with each other.

In the description of the present disclosure, the terms "one embodiment," "some embodiments," "example," "specific example," or "some examples," and the like may indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described may be combined in a suitable manner in any one or more embodiments or examples. In addition, various embodiments or examples described in the specification, as well as features of various embodiments or examples, may be combined and reorganized.

In some embodiments, the control and/or interface software or app can be provided in a form of a non-transitory computer-readable storage medium having instructions stored thereon is further provided. For example, the non-transitory computer-readable storage medium may be a Read-Only Memory (ROM), a Random-Access Memory (RAM), a Compact Disc Read-Only Memory (CD-ROM), a magnetic tape, a floppy disk, optical data storage equipment, a flash drive such as a USB drive or an SD card, and the like.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more modules of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, that is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium may be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures. For example, the devices can be controlled remotely through the Internet, on a smart phone, a tablet computer or other types of computers, with a web-based graphic user interface (GUI).

A computer program (also known as a program, software, software application, app, script, or code) can be written in any form of programming language, including compiled or interpreted languages, declarative or procedural languages, and it can be deployed in any form, including as a stand-alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a mark-up language document), in a single file dedicated to the program in question, or in multiple coordinated files (e.g., files that store one or more modules, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode) display, other flexible configuration, or any other monitor for displaying information to the user and a keyboard, a pointing device, e.g., a mouse, trackball, etc., or a touch screen, touch pad, etc., by which the user can provide input to the computer.

Other types of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In an example, a user can speak commands to the audio processing device, to perform various operations.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components. The components of the system can be interconnected by any form or medium of digital data communication, e.g., a communication network. Examples of communication networks include a local area network ("LAN") and a wide area network ("WAN"), an internetwork (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombinations.

Moreover, although features may be described above as acting in certain combinations and even initially claimed as such, one or more features from a claimed combination can in some cases be excised from the combination, and the claimed combination may be directed to a subcombination or variations of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

Thus, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing may be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A power supply on-off detection circuit comprising: a signal acquisition circuit; a signal conversion circuit; and a signal processing circuit; wherein
   the signal acquisition circuit is coupled to a power supply through a switch, and is configured to collect an alternating current signal output by the power supply, and to output the alternating current signal to the signal conversion circuit;
   the signal conversion circuit is configured to convert the alternating current signal into a voltage signal, and to output the voltage signal to the signal processing circuit; and
   the signal processing circuit is coupled to the signal conversion circuit, and is configured to convert the voltage signal into a level signal, wherein the level signal is used to determine whether the power supply is on or off by determining whether the switch is switched on or off;
   wherein the signal acquisition circuit comprises a current transformer; and
   a primary side of the current transformer is configured to collect the alternating current signal output by the power supply, and to couple the alternating current signal collected by the primary side to a secondary side of the current transformer according to a preset ratio to obtain an alternating current signal reduced to a specified value;
   wherein the signal processing circuit comprises a signal amplifying circuit, and the signal amplifying circuit is coupled to the current transformer or the signal processing circuit to amplify the alternating current signal reduced and output by the current transformer.

2. The power supply on-off detection circuit according to claim 1, wherein the signal acquisition circuit further comprises a transient voltage suppression diode, and the transient voltage suppression diode is coupled in parallel with the current transformer to discharge a surge current of the current transformer.

3. The power supply on-off detection circuit according to claim 1, wherein the signal conversion circuit comprises: a rectifier bridge and a load resistor;
   the rectifier bridge is coupled in parallel with the signal acquisition circuit and is configured to convert the alternating current signal output by the signal acquisition circuit into a direct current signal; and
   the load resistance is coupled in parallel with the rectifier bridge, and is configured to convert the direct current signal into the voltage signal.

4. The power supply on-off detection circuit according to claim 3, wherein the signal conversion circuit further comprises a current limiting resistor coupled in series with one of two output ends of the rectifier bridge.

5. The power supply on-off detection circuit according to claim 4, wherein the signal conversion circuit further comprises a voltage stabilizing component coupled in parallel with the load resistor.

6. The power supply on-off detection circuit according to claim 3, wherein the signal conversion circuit further comprises: an energy-storage capacitor coupled in parallel with the rectifier bridge.

7. The power supply on-off detection circuit according to claim 1, wherein the signal processing circuit comprises a voltage comparator and voltage divider resistors; and
   a first input end of the voltage comparator is coupled to an output end of the signal conversion circuit to receive the voltage signal, and a second input end of the voltage comparator is coupled to the voltage divider resistors to generate a reference voltage.

8. A smart home system comprising the power supply on-off detection circuit according to claim 1, further comprising a smart appliance coupled to the power supply through the switch, wherein the switch comprises a flash break switch.

9. A power supply on-off detection method, comprising:
   collecting an alternating current signal of a power supply, and converting the alternating current signal into a voltage signal;
   determining a level signal representing a change state of the alternating current signal based on the voltage signal; and
   determining whether the power supply is on or off by determining whether a switch coupled to the power supply is switched on or off based on the level signal;
   wherein the collecting the alternating current signal of the power supply comprises:
   collecting by a primary side of a current transformer the alternating current signal output by the power supply, and coupling the alternating current signal collected by the primary side to a secondary side of the current transformer according to a preset ratio to obtain an alternating current signal reduced to a specified value;
   the method further comprising: before the determining the level signal representing the change state of the alternating current signal, amplifying the alternating current signal reduced to the specified value and outputting the amplified alternating current signal.

10. The power supply on-off detection method according to claim 9, wherein the converting the alternating current signal into the voltage signal comprises:
    converting the alternating current signal into a direct current signal, and converting the direct current signal into the voltage signal.

11. The power supply on-off detection method according to claim 10, further comprising:
  performing a current limitation on the direct current signal converted.

12. The power supply on-off detection method according to claim 10, further comprising:
  adjusting a voltage of the direct current signal at a zero-crossing point not to be zero.

13. The power supply on-off detection method according to claim 9, wherein, the determining whether the power supply is on or off by determining whether the switch coupled to the power supply is switched on or off based on the level signal comprises:
  if the level signal remains a low level within a specified time period, determining that the switch coupled to the power supply is switched off, and determining that the power supply is in an off state; and
  if the level signal remains a high level within the specified time period, determining that the switch coupled to the power supply is switched on, and determining that the power supply is in an on state.

14. The power supply on-off detection method according to claim 9, further comprising:
  limiting the alternating current signal coupled to the secondary side of the current transformer.

15. A non-transitory computer-readable storage medium having instructions stored therein, wherein when the instructions are executed by a processor of an electronic device, the electronic device is caused to execute a power supply on-off detection method, wherein the method comprises:
  collecting an alternating current signal output by a power supply, and converting the alternating current signal into a voltage signal;
  determining a level signal representing a change state of the alternating current signal based on the voltage signal; and
  determining whether the power supply is on or off by determining whether a switch coupled to the power supply is switched on or off based on the level signal;
  wherein the collecting the alternating current signal of the power supply comprises:
  collecting by a primary side of a current transformer the alternating current signal output by the power supply, and coupling the alternating current signal collected by the primary side to a secondary side of the current transformer according to a preset ratio to obtain an alternating current signal reduced to a specified value;
  the method further comprising: before the determining the level signal representing the change state of the alternating current signal, amplifying the alternating current signal reduced to the specified value and outputting the amplified alternating current signal.

16. The smart home system according to claim 8, wherein the smart home system is configured to determine a state of the flash break switch to facilitate determining action times of the flash break switch, thereby realizing identification of actions of the flash break switch and switching a state of smart appliance; improving detection sensitivity of small current signals; and reducing power consumption of the smart appliance.

* * * * *